United States Patent
Kanemaru et al.

(10) Patent No.: US 10,883,895 B2
(45) Date of Patent: Jan. 5, 2021

(54) ABNORMALITY DIAGNOSTIC DEVICE FOR POWER TRANSMISSION MECHANISM AND ABNORMALITY DIAGNOSTIC METHOD FOR POWER TRANSMISSION MECHANISM

(71) Applicant: Mitsubishi Electric Corporation, Chiyoda-ku (JP)

(72) Inventors: Makoto Kanemaru, Chiyoda-ku (JP); Mitsuru Tsukima, Chiyoda-ku (JP); Takuya Ohkubo, Chiyoda-ku (JP); Tomoko Takasuka, Chiyoda-ku (JP); Toshihiko Miyauchi, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 67 days.

(21) Appl. No.: 16/341,350

(22) PCT Filed: Sep. 1, 2017

(86) PCT No.: PCT/JP2017/031609
§ 371 (c)(1),
(2) Date: Apr. 11, 2019

(87) PCT Pub. No.: WO2018/109993
PCT Pub. Date: Jun. 21, 2018

(65) Prior Publication Data
US 2020/0284690 A1 Sep. 10, 2020

(30) Foreign Application Priority Data
Dec. 15, 2016 (JP) .................................. 2016-243053

(51) Int. Cl.
*G01M 13/02* (2019.01)
*H02P 29/024* (2016.01)
(Continued)

(52) U.S. Cl.
CPC ............ *G01M 13/02* (2013.01); *G01H 1/003* (2013.01); *G01R 31/343* (2013.01); *H02P 29/0241* (2016.02)

(58) Field of Classification Search
CPC .. G01M 13/02; H02P 29/0241; G01R 31/343; G01H 1/003
(Continued)

(56) References Cited

U.S. PATENT DOCUMENTS 4,965,513 A 10/1990 Haynes et al.
9,845,012 B2 12/2017 Lu et al.
(Continued)

FOREIGN PATENT DOCUMENTS

JP S60-008905 A 1/1985
JP H11-083686 A 3/1999
(Continued)

OTHER PUBLICATIONS

Office Action dated Apr. 1, 2020 in German Patent Application No. 11 2017 005 650.0, 27 pages (with English translation of JP2010-288352).
(Continued)

*Primary Examiner* — Bentsu Ro
(74) *Attorney, Agent, or Firm* — Xsensus LLP

(57) ABSTRACT

The power transmission mechanism abnormality diagnostic device includes a monitoring diagnosis unit for performing determination as to abnormality of a power transmission mechanism, and a current detector connected to a power supply of an electric motor, wherein the monitoring diagnosis unit includes an analysis unit for analyzing current transmitted from the current detector and an abnormality determination unit for performing determination as to abnormality of the power transmission mechanism on the basis of a result of analysis by the analysis unit.

20 Claims, 18 Drawing Sheets

(51) Int. Cl.
*G01H 1/00* (2006.01)
*G01R 31/34* (2020.01)

(58) Field of Classification Search
USPC .......................................................... 318/560
See application file for complete search history.

(56) References Cited

U.S. PATENT DOCUMENTS

| | | | |
|---|---|---|---|
| 10,393,621 B2 | 8/2019 | Jaramillo-Velasques et al. | |
| 10,715,074 B2* | 7/2020 | Tsugawa | B60L 3/0061 |
| 2002/0008492 A1* | 1/2002 | Nagayama | H02P 21/22 |
| | | | 318/727 |
| 2006/0009932 A1 | 1/2006 | Koh | |
| 2008/0234964 A1 | 9/2008 | Miyasaka et al. | |
| 2011/0181292 A1* | 7/2011 | Oowada | G01R 35/00 |
| | | | 324/537 |
| 2013/0013138 A1 | 1/2013 | Lu et al. | |
| 2016/0231382 A1* | 8/2016 | Hirose | G01R 31/3277 |
| 2017/0268960 A1 | 9/2017 | Jaramillo-Velasques et al. | |
| 2019/0003928 A1* | 1/2019 | Unuma | G01M 13/04 |
| 2020/0021217 A1* | 1/2020 | Hano | H02P 27/12 |

FOREIGN PATENT DOCUMENTS

| | | |
|---|---|---|
| JP | 2006-234785 A | 9/2006 |
| JP | 2010-288352 A | 12/2010 |
| JP | 5985099 B1 | 9/2016 |
| JP | 6190841 B2 | 8/2017 |
| WO | 2004/070402 A1 | 8/2004 |
| WO | WO 2009/096551 A1 | 8/2009 |
| WO | 2013/006742 A1 | 1/2013 |
| WO | 2016/026558 A1 | 2/2016 |

OTHER PUBLICATIONS

International Search Report dated Nov. 21, 2017 in PCT/JP2017/031609 filed on Sep. 1, 2017.
Written Opposition dated Aug. 6, 2020, in corresponding Japanese Application No. 2018556178, 91 pages.
Chinese Office Action dated Jun. 17, 2020 of the corresponding Chinese patent application No. CN201780071079.9
Dong Jiacheng et al, "Research of Diagnosis and Analysis Based on Motor Current Signal of Machine tool" Machine Tool & Hydraulics, vol. 39 No. 19, p. 133-136, Oct. 2011, ISSN 1001-3881.

* cited by examiner

ABNORMALITY DIAGNOSTIC DEVICE FOR POWER TRANSMISSION MECHANISM AND ABNORMALITY DIAGNOSTIC METHOD FOR POWER TRANSMISSION MECHANISM

TECHNICAL FIELD

The present invention relates to an abnormality diagnostic device for a power transmission mechanism connected to an electric motor, and an abnormality diagnostic method for the power transmission mechanism.

BACKGROUND ART

A plant has many mechanical facilities connected to an electric motor via a power transmission mechanism, and in abnormality diagnosis for the power transmission mechanism, in many cases, a maintenance department performs determination through diagnosis by person's senses. In particular, for a facility of high importance, it is necessary to perform diagnosis regularly. Further, if the power transmission mechanism starts to deteriorate, the deterioration progresses at an accelerating pace.

Accordingly, there is increasing interest in technology for constantly monitoring the electric motor side connected to the power transmission mechanism. However, constant monitoring for the electric motor is, in many cases, based on the premise that various sensors are attached for individual electric motors. For example, a torque meter, an encoder, an acceleration sensor, and the like are attached.

As a diagnosis system for a bearing, a method is disclosed in which a plurality of power spectra are extracted from measurement data of a damage occurrence detection sensor attached to the bearing, and then are compared with spectra due to abnormality, which are calculated in advance, thereby diagnosing the cause for the abnormality (see Patent Document 1).

CITATION LIST

Patent Document

Patent Document 1: Re-publication of PCT International Publication WO2009/096551

SUMMARY OF THE INVENTION

Problems to be Solved by the Invention

However, the sensor disclosed in Patent Document 1 is attached to the bearing itself, and therefore has a problem that the sensor disclosed in Patent Document 1 cannot be applied to a power transmission mechanism such as a belt or a chain to which the sensor cannot be directly attached.

The present invention has been made to solve the above problem, and an object of the present invention is to provide a power transmission mechanism abnormality diagnostic device and a power transmission mechanism abnormality diagnostic method that are capable of immediately and easily detecting abnormality that occurs in a power transmission mechanism connected to an electric motor.

Solution to the Problems

A power transmission mechanism abnormality diagnostic device according to the present invention is a power transmission mechanism abnormality diagnostic device for detecting abnormality of a power transmission mechanism which transmits power from an electric motor to a mechanical facility as a load, the power transmission mechanism abnormality diagnostic device including: a monitoring diagnosis unit for performing determination as to abnormality of the power transmission mechanism; and a current detector connected to a power supply line of the electric motor. The monitoring diagnosis unit includes: an analysis unit for analyzing current transmitted from the current detector; and an abnormality determination unit for performing determination as to abnormality of the power transmission mechanism on the basis of a result of analysis by the analysis unit.

A power transmission mechanism abnormality diagnostic method according to the present invention is a power transmission mechanism abnormality diagnostic method for detecting abnormality of a power transmission mechanism which transmits power from an electric motor to a mechanical facility as a load, the power transmission mechanism abnormality diagnostic method including: a first step of measuring current flowing through the electric motor; a second step of transmitting a value of the current to a monitoring diagnosis unit; a third step of performing frequency analysis of the current; a fourth step of detecting outstanding spectrum peaks from a drive current spectral waveform obtained in the second step; a fifth step of detecting, among the spectrum peaks detected in the fourth step, a plurality of spectrum peaks that are located at equal intervals and have signal intensities equal to or greater than a threshold value, and determining the plurality of spectrum peaks as power transmission mechanism frequency bands that occur in accordance with a rotation speed of the power transmission mechanism; a sixth step of detecting a number of sideband waves other than a power supply frequency, a power transmission mechanism frequency, and a rotation frequency of the electric motor; and a seventh step of determining whether or not abnormality occurs in the power transmission mechanism, on the basis of the number of the sideband waves.

Another power transmission mechanism abnormality diagnostic method according to the present invention is a power transmission mechanism abnormality diagnostic method for detecting abnormality of power transmission mechanisms which transmit powers from a plurality of electric motors to respective mechanical facilities as loads, the power transmission mechanism abnormality diagnostic method including: a first step of measuring currents flowing through the electric motors; a second step of transmitting values of the currents to a monitoring diagnosis unit; a third step of performing frequency analysis of the currents; and a two-hundred-seventh step of comparing drive current spectral waveforms obtained in the third step, and determining whether or not abnormality occurs in the power transmission mechanism.

Effect of the Invention

With the power transmission mechanism abnormality diagnostic device and the power transmission mechanism abnormality diagnostic method according to the present invention, abnormality occurring in the power transmission mechanism connected to the electric motor can be immediately and easily detected at low cost by using the current detector without using a special sensor or the like. In addition, also for a power transmission mechanism to which a sensor cannot be directly attached, it is possible to easily detect abnormality.

DESCRIPTION OF EMBODIMENTS

Embodiment 1

Hereinafter, a power transmission mechanism abnormality diagnostic device and a power transmission mechanism abnormality diagnostic method according to embodiment 1 of the present invention will be described with reference to the drawings.

Figure 1:
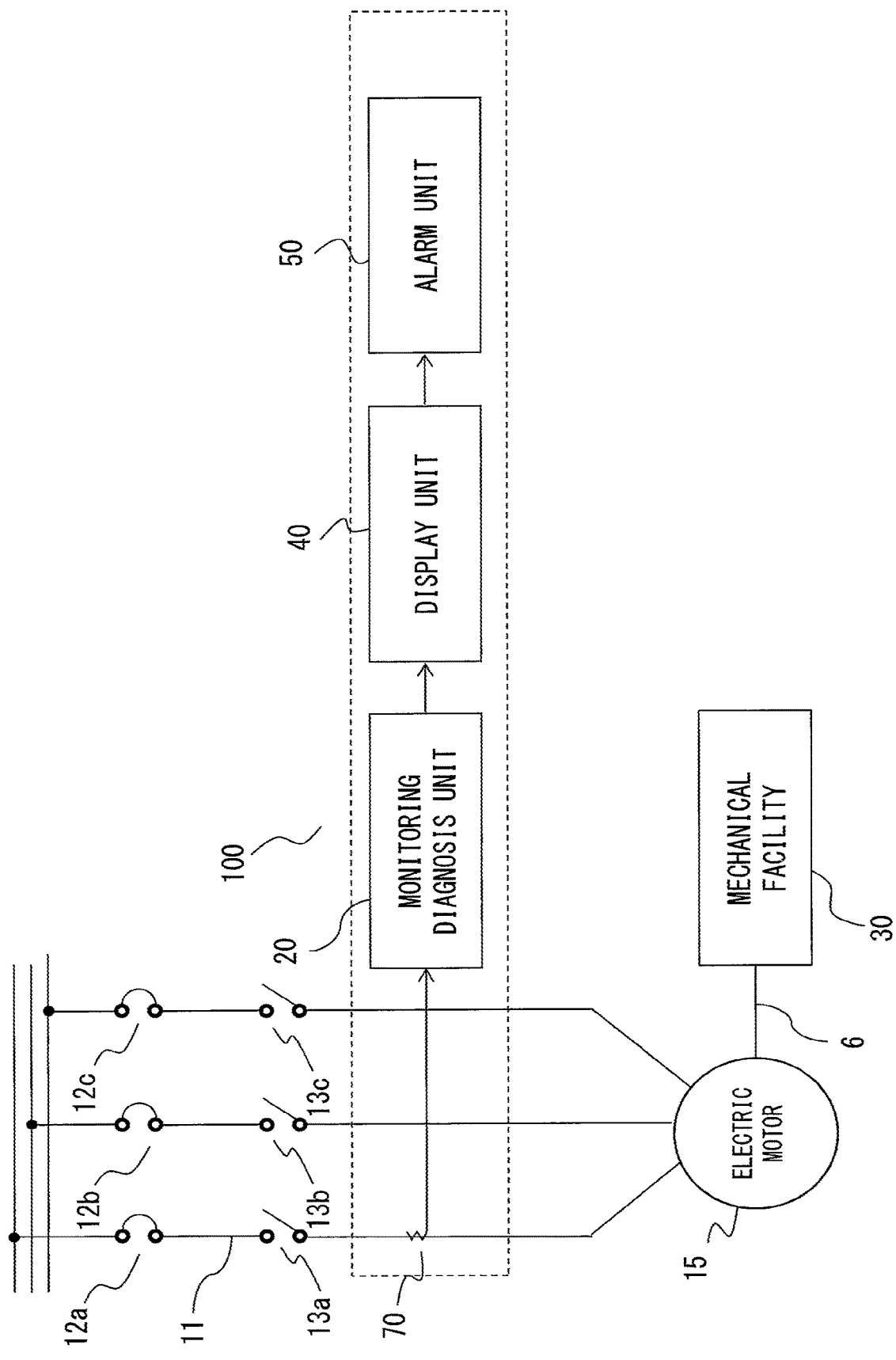
FIG. 1 is a diagram showing the configuration of an abnormality diagnostic device according to embodiment 1 of the present invention.

FIG. 1 is a diagram showing an electric motor 15 managed by a motor control center and the configuration of an abnormality diagnostic device 100 for detecting abnormality of a belt mechanism 6 (power transmission mechanism) which transmits power from the electric motor 15 to a mechanical facility 30 as a load.

Figure 2:
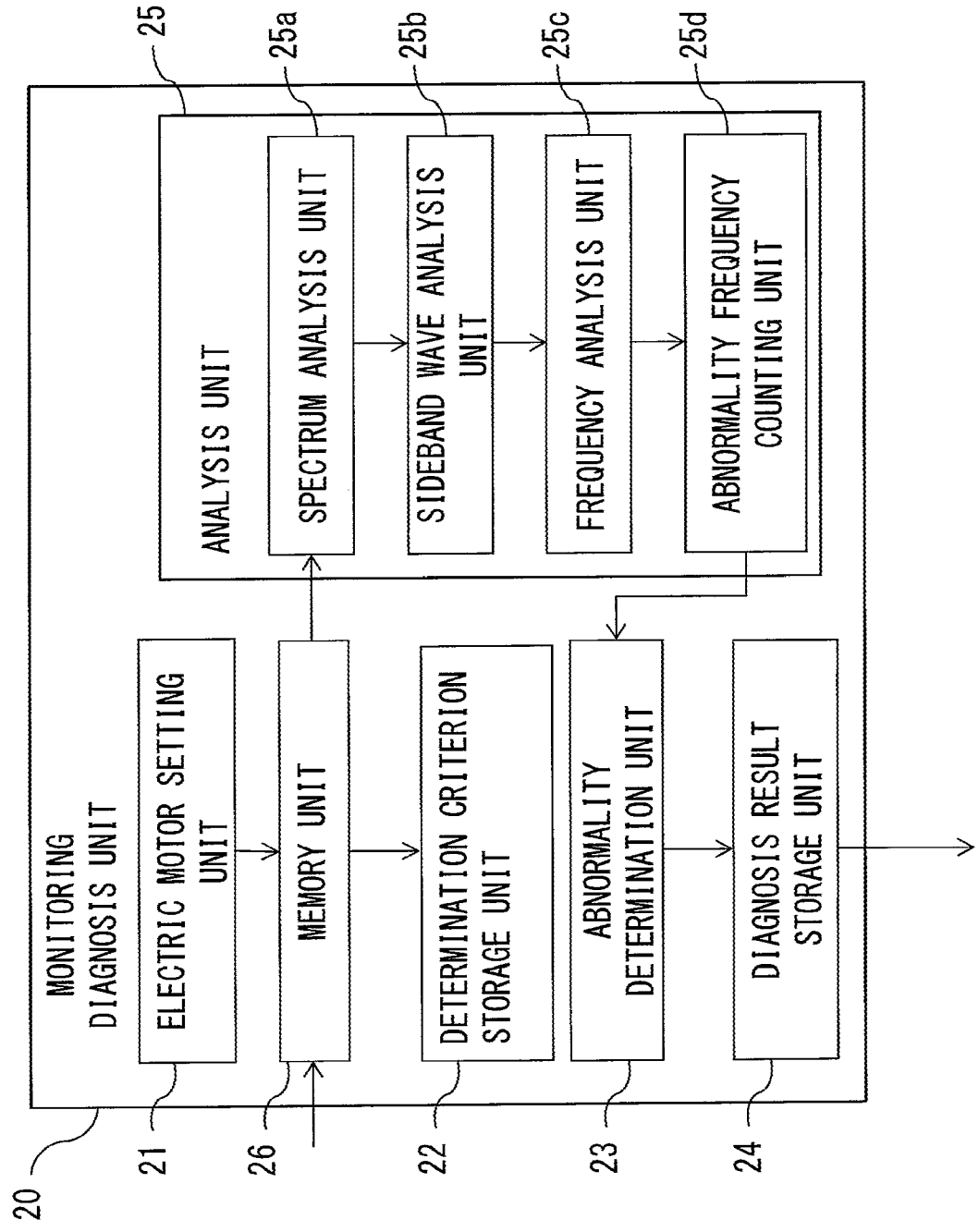
FIG. 2 is a diagram showing the configuration of a monitoring diagnosis unit of the abnormality diagnostic device according to embodiment 1 of the present invention.

FIG. 2 is a diagram showing the configuration of a monitoring diagnosis unit 20 of the abnormality diagnostic device 100.

Figure 3:
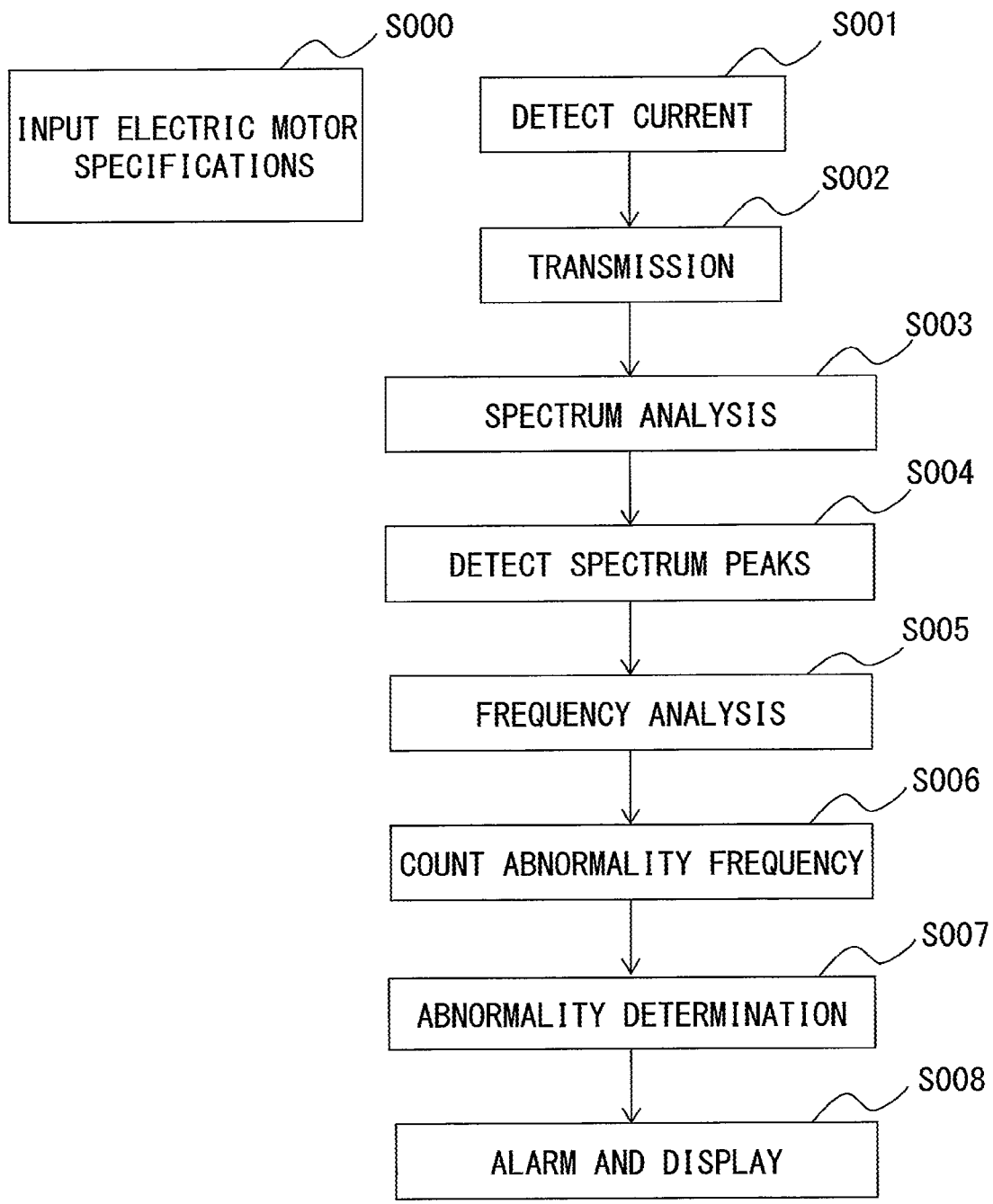
FIG. 3 shows a processing flow of the abnormality diagnostic device according to embodiment 1 of the present invention.

FIG. 3 shows a processing flow of the abnormality diagnostic device 100.

Figure 14:
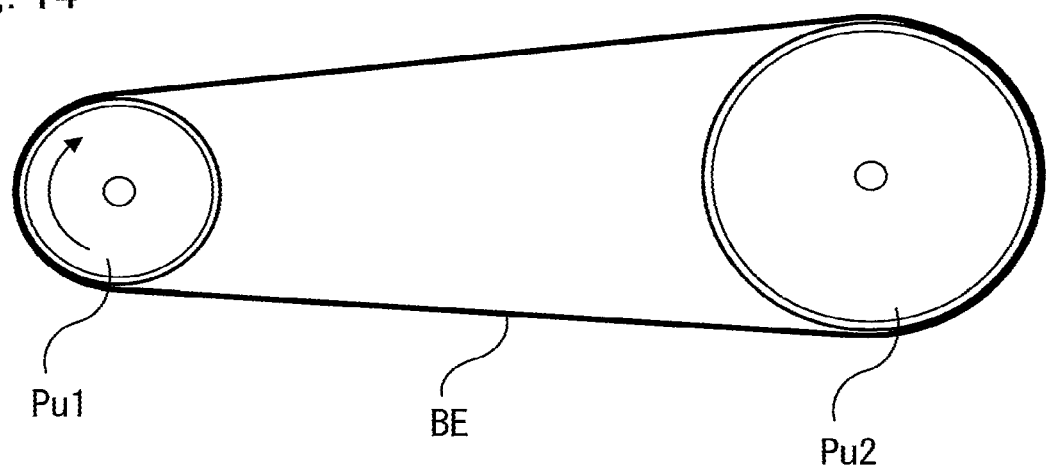
FIG. 14 shows a belt mechanism according to embodiment 1 of the present invention.

FIG. 14 shows the belt mechanism 6.

The belt mechanism 6 is configured such that a belt BE (power transmission member) is wound around a pulley Put connected to the rotary shaft of the electric motor 15 and a pulley Pu2 connected to the drive shaft of the mechanical facility 30.

Figure 15:
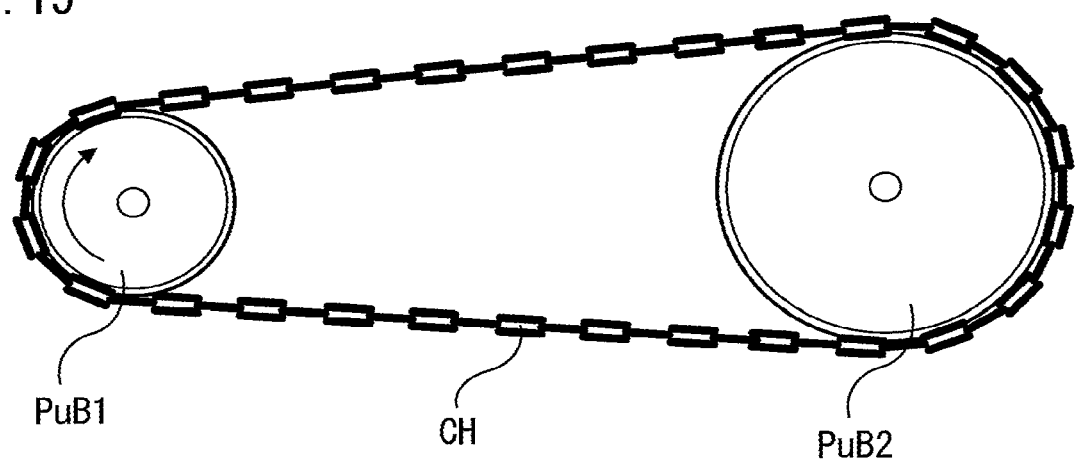
FIG. 15 shows a chain mechanism according to embodiment 1 of the present invention.

FIG. 15 shows a chain mechanism 6B as the power transmission mechanism.

The chain mechanism 6B is configured such that a chain CH (power transmission member) is wound around a pulley PuB1 connected to the rotary shaft of the electric motor 15 and a pulley PuB2 connected to the drive shaft of the mechanical facility 30.

The abnormality diagnostic device 100 includes a monitoring diagnosis unit 20, a display unit 40, an alarm unit 50, and a current detector 70 connected to one of three-phase electric lines connected to the electric motor 15.

The monitoring diagnosis unit 20 of the abnormality diagnostic device 100 includes an electric motor setting unit 21, a determination criterion storage unit 22, an abnormality determination unit 23, a diagnosis result storage unit 24, an analysis unit 25, and a memory unit 26.

The electric motor 15 is connected to power supply lines 11 for driving the electric motor. On the power supply lines 11, a plurality of wiring circuit breakers 12a, 12b, 12c and a plurality of electromagnetic contactors 13a, 13b, 13c are connected.

The current detector 70 measures current flowing through wiring lines (step S001), and the acquired current data is transmitted to the monitoring diagnosis unit 20 (step S002). Abnormality of the belt mechanism 6 determined by the monitoring diagnosis unit 20 is sent to the display unit 40 and the alarm unit 50, which respectively indicate the abnormality on the display and by an alarm (step S008), thereby notifying a monitoring responsible person of the abnormality. Here, the belt mechanism 6 is configured to transmit a drive force from the electric motor 15 to a load via the belt BE, and in the following description, an example in which abnormality of the belt BE is detected from current data obtained from the current detector 70 will be described. However, the power transmission mechanism is not limited to the belt mechanism 6. The power transmission mechanism may be a winding transmission device such as the chain mechanism 6B as shown in FIG. 15 or a rope mechanism (not shown).

The current detector 70 may be provided for each phase of the three-phase power supply lines. However, it is only necessary to perform measurement for one of the phases. Further, the current detector 70 may be provided at any location that allows measurement of drive current of the electric motor 15. This indicates that detection accuracy does not vary depending on the measurement location. One monitoring diagnosis unit 20 is provided for each electric motor 15.

The electric motor setting unit 21 of the monitoring diagnosis unit 20 is used for inputting the specifications of the electric motor 15 such as the power supply frequency, the number of poles, and the rated rotation speed on the basis of information of the rating plate attached to the electric motor 15, in order to accurately specify the rotation speed of the electric motor 15 online in real time (step S000). The rotation speed of the electric motor 15 under no load can be calculated by 120·fs/p (fs: power supply frequency, p: number of poles). Therefore, the rotation speed of the electric motor 15 necessarily becomes a value between the rotation speed under no load and the rated rotation speed, so that the range of the rotation speed is limited. The information about the specifications of the electric motor 15 is stored into the memory unit 26.

The determination criterion storage unit 22 is used for storing a threshold value or the like for performing determination as to abnormality of the belt mechanism 6. The abnormality determination unit 23 is used for performing final determination as to abnormality of the belt mechanism 6. The diagnosis result storage unit 24 is a place where a result of determination by the abnormality determination unit 23 is stored.

Next, the details of the analysis unit 25 of the monitoring diagnosis unit 20 will be described.

Figure 4:
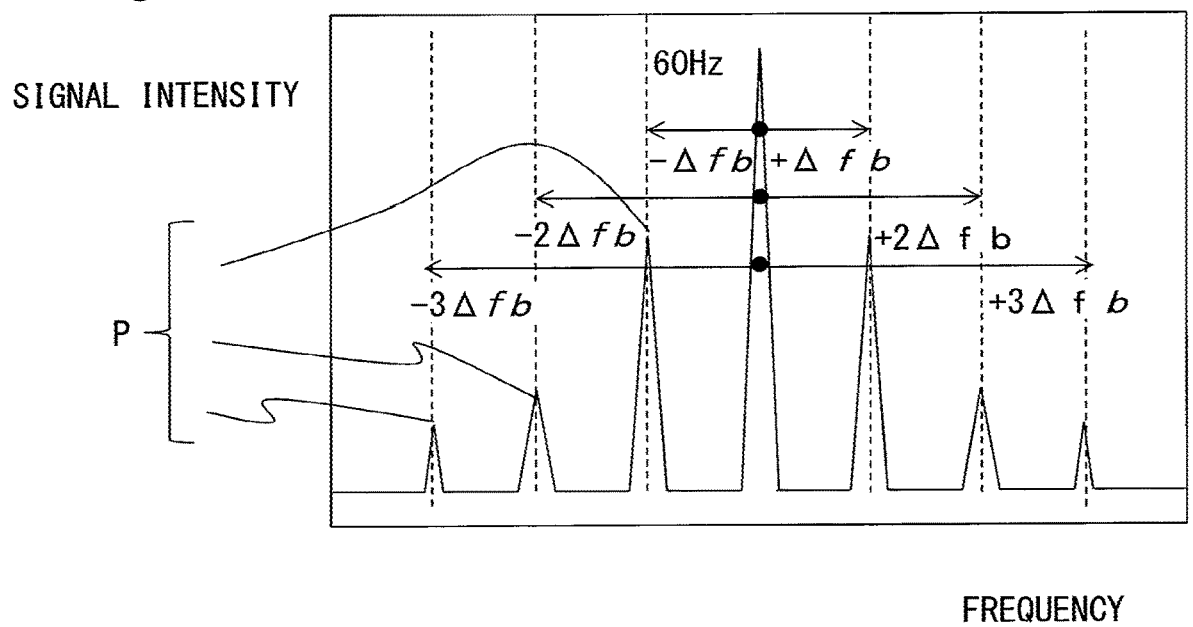
FIG. 4 shows an electric motor drive current spectral waveform of an electric motor according to embodiment 1 of the present invention.

FIG. 4 shows an electric motor drive current spectral waveform (hereinafter, simply referred to as spectral waveform) of the electric motor 15. The vertical axis indicates the signal intensity, and the horizontal axis indicates the frequency. The analysis unit 25 analyzes current data transmitted from the current detector 70 and stored in the memory unit 26. The analysis unit 25 includes a spectrum analysis unit 25a, a sideband wave analysis unit 25b, a frequency analysis unit 25c, and an abnormality frequency counting unit 25d. The spectrum analysis unit 25a is used for performing current FFT (Fast Fourier Transform) analysis (frequency analysis) on the current obtained from the current detector 70 (step S003).

First, the sideband wave analysis unit 25b detects all spectrum peaks from a spectral waveform obtained by the spectrum analysis unit 25a (step S004). Preferably, the detection range is 0 to 1000 Hz. Next, the sideband wave analysis unit 25b determines a spectrum peak that satisfies a condition of a sideband wave from among the detected spectrum peaks.

The carrier wave includes a frequency component in the vicinity of the carrier wave frequency. Such a component is a sideband wave. In the spectral waveform shown in FIG. 4, spectrum peaks P appear at equal intervals on both of the higher side and the lower side with respect to the power supply frequency (here, 60 Hz) as the center. That is, spectrum peaks P appear at intervals of +Δfb, +2Δfb, +3Δfb, etc., on the higher side and −Δfb, −2Δfb, 3Δfb, etc., on the lower side with respect to the power supply frequency. Each of these spectrum peaks P is a spectrum peak as one sideband wave. The signal intensities and the appearance pattern of the spectrum peaks P vary depending on the rotation speed of the electric motor 15.

Next, the reason why the spectrum peaks P appear will be described. The belt BE shown in FIG. 14 is connected with the pulley Pu1 connected to the rotary shaft of the electric motor 15, so that the speed variation of the belt BE causes variation in the rotation speed of the rotor of the electric motor 15, and this also influences the drive current of the electric motor 15. At this time, speed variation also occurs at the frequency at which the belt BE makes one revolution, and therefore spectrum peaks P corresponding to the frequency at which the belt BE makes one revolution and harmonics thereof, appear. If Dr is defined as the radius of the pulley Put connected to the rotary shaft of the electric motor 15, fr is defined as the rotation speed of the rotary shaft of the electric motor 15, and L is defined as the length of the belt BE, a frequency band fb in which the spectrum peak P appears is represented by the following Expression 1.

$$fb=(2\pi Dr \cdot fr)/L \qquad \text{Expression 1}$$

Thus, the frequency band fb is determined by the radius Dr of the pulley Put, the rotation speed fr of the rotary shaft of the electric motor 15, and the length L of the belt BE. When frequency analysis is performed on the current waveform, sideband waves of fs±fb appear on both sides of the power supply frequency fs. At the same time, harmonic components fs±2 fb and fs±3 fb of the sideband waves are also observed.

Figure 5:
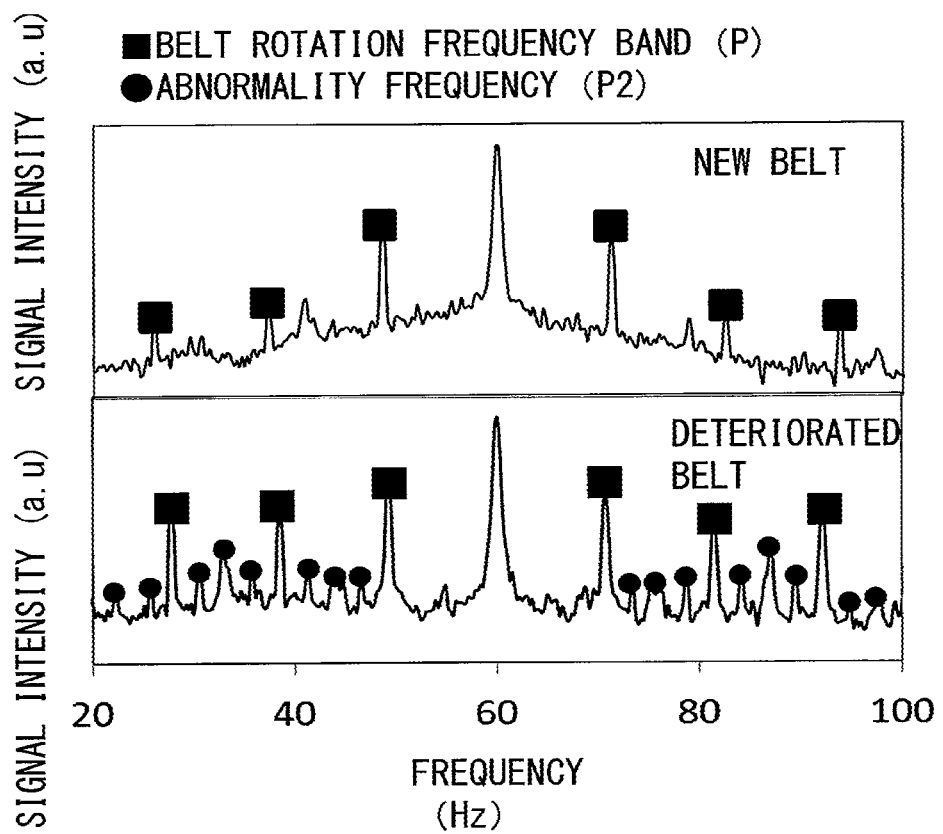
FIG. 5 shows spectral waveforms in normal case and abnormal case.

FIG. 5 shows spectral waveforms of the electric motor 15 in the case where the belt mechanism 6 in a normal state is mounted and in the case where the belt mechanism 6 in an abnormal state is mounted. The upper side indicates a spectral waveform in the case where a new belt BE in a normal state is mounted, and the lower side indicates a spectral waveform in the case where a deteriorated belt BE in an abnormal state is mounted. The vertical axis indicates the signal intensity and the horizontal axis indicates the frequency. In the graphs, square marks and circle marks indicate spectrum peaks of sideband waves. The frequency analysis unit 25c analyzes belt rotation frequency bands (power transmission mechanism frequency band) which occur in accordance with the rotation speed of the belt mechanism 6 (step S005). That is, from among the spectrum peaks of the sideband waves detected by the sideband wave analysis unit 25b, a plurality of spectrum peaks P that are located at equal intervals and have signal intensities greater than a threshold value so as to outstand are detected, and the plurality of spectrum peaks P are determined as belt rotation frequency bands.

For discrimination from abnormality frequency bands, waveforms of belt rotation frequency bands may be determined in advance when the electric motor 15 and the mechanical facility 30 are normal. Since the spectrum peaks P vary depending on the rotation speed of the electric motor 15, the rotation speed of the electric motor 15 may be constantly detected and used for determination of belt rotation frequency bands.

The signal intensities of the spectrum peaks P occurring due to the belt mechanism 6 tend to be greater than the signal intensities of the other frequency bands, etc., except the power supply frequency band. Therefore, it is possible to determine belt rotation frequency bands also from the magnitudes of the signal intensities. If information such as the length of the belt BE and the radius Dr of the pulley Put on the electric motor 15 side can be inputted in advance, it is possible to detect belt rotation frequency bands with high accuracy.

The abnormality frequency counting unit 25d is an analysis unit for detecting the number of sideband waves other than: the power supply frequency and harmonics thereof; the belt rotation frequency and harmonics thereof; and the rotation frequency of the electric motor. For example, as an actual case, if the belt BE is deteriorated, as shown in FIG. 5, a plurality of spectrum peaks P2 (parts indicated by filled circle marks in FIG. 5) are detected at locations other than the belt rotation frequency bands (parts indicated by filled square marks in FIG. 5). The values of the signal intensities of the spectrum peaks P2 are obtained and the number thereof is counted (step S006).

Next, the reason why the plurality of spectrum peaks P2 arise at locations other than the belt rotation frequency bands (parts indicated by filled square marks in FIG. 5) will be described. In the case where the belt BE is deteriorated and crack occurs in the belt BE, when the belt cracked part comes into contact with the rotary shaft of the electric motor 15, variation in the rotation speed of the rotary shaft of the electric motor 15, i.e., variation in the rotation speed of the rotor of the electric motor 15 occurs. This variation influences the drive current of the electric motor 15. Thus, the spectrum peak P2 arises in a frequency band corresponding to the collision frequency at which the belt cracked part collides with the rotary shaft.

Next, the abnormality determination unit 23 of the monitoring diagnosis unit 20 determines whether or not abnormality occurs in the belt mechanism 6 (step S007). For example, it is determined that abnormality occurs, if ten or more spectrum peaks P2 having signal intensities greater than a threshold value are detected. The threshold value is set in advance in the determination criterion storage unit 22. Alternatively, data in a normal state may be stored in a memory and the threshold value may be determined by performing statistical processing or the like on the data. In addition, temporal change in the signal intensity of the abnormality frequency band may be observed. That is, the fact that the signal intensity of the abnormality frequency band greatly changes when the deterioration progresses may be focused on. As a diagnosis result, whether or not abnormality occurs is stored into the diagnosis result storage unit 24, and finally, issuance of an alarm and/or alarm indication is performed as necessary.

With the abnormality diagnostic device 100 and the abnormality diagnostic method for a power transmission mechanism according to embodiment 1 of the present invention, abnormality occurring in the power transmission mechanism connected to the electric motor 15 can be immediately and easily detected at low cost by using the current detector 70 without using a special sensor or the like. In addition, also for a power transmission mechanism to which a sensor cannot be directly attached, it is possible to easily detect abnormality.

In addition, by detecting abnormality at a stage before the belt BE of the belt mechanism 6 is broken, it is possible to shorten the downtime of the facility.

In the present embodiment, the case of detecting abnormality of the belt mechanism 6 which is a power transmission mechanism has been described as an example. However, for any power transmission mechanism connected to the electric motor 15, irrespective of its configuration, abnormality thereof can be detected on the basis of current data detected by the current detector 70.

Embodiment 2

Hereinafter, with reference to the drawings, a power transmission mechanism abnormality diagnostic device and a power transmission mechanism abnormality diagnostic method according to embodiment 2 of the present invention will be described, focusing on difference from embodiment 1.

Figure 6:
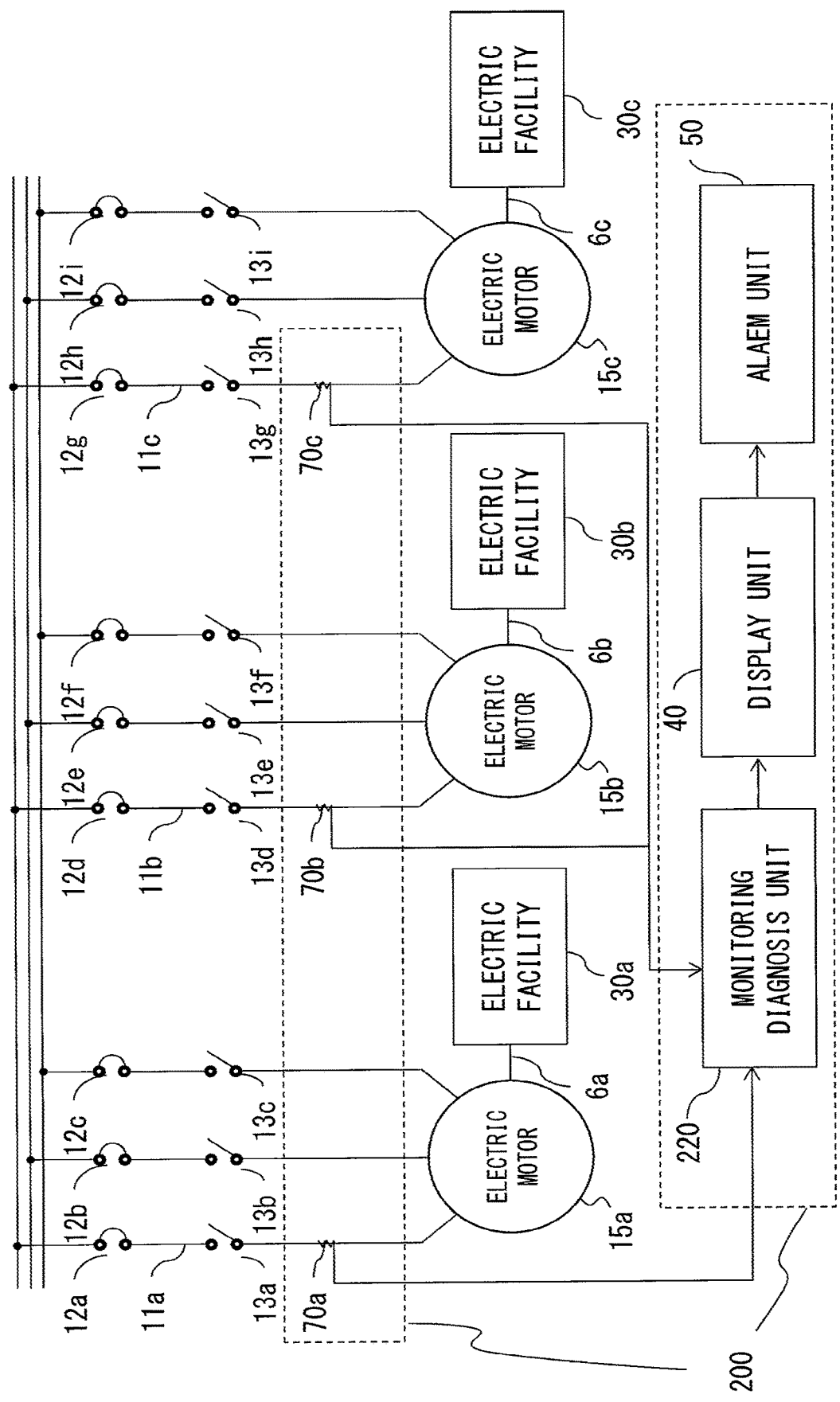
FIG. 6 is a diagram showing the configuration of an abnormality diagnostic device according to embodiment 2 of the present invention.

FIG. 6 is a diagram showing electric motors 15*a*, 15*b*, 15*c* managed by a motor control center and the configuration of an abnormality diagnostic device 200 (parts enclosed by two broken-line frames) for detecting abnormality of belt mechanisms 6*a*, 6*b*, 6*c* (power transmission mechanisms) which transmit powers from electric motors 15*a* to 15*c* to respective mechanical facilities 30*a*, 30*b*, 30*c* as loads.

Figure 7:
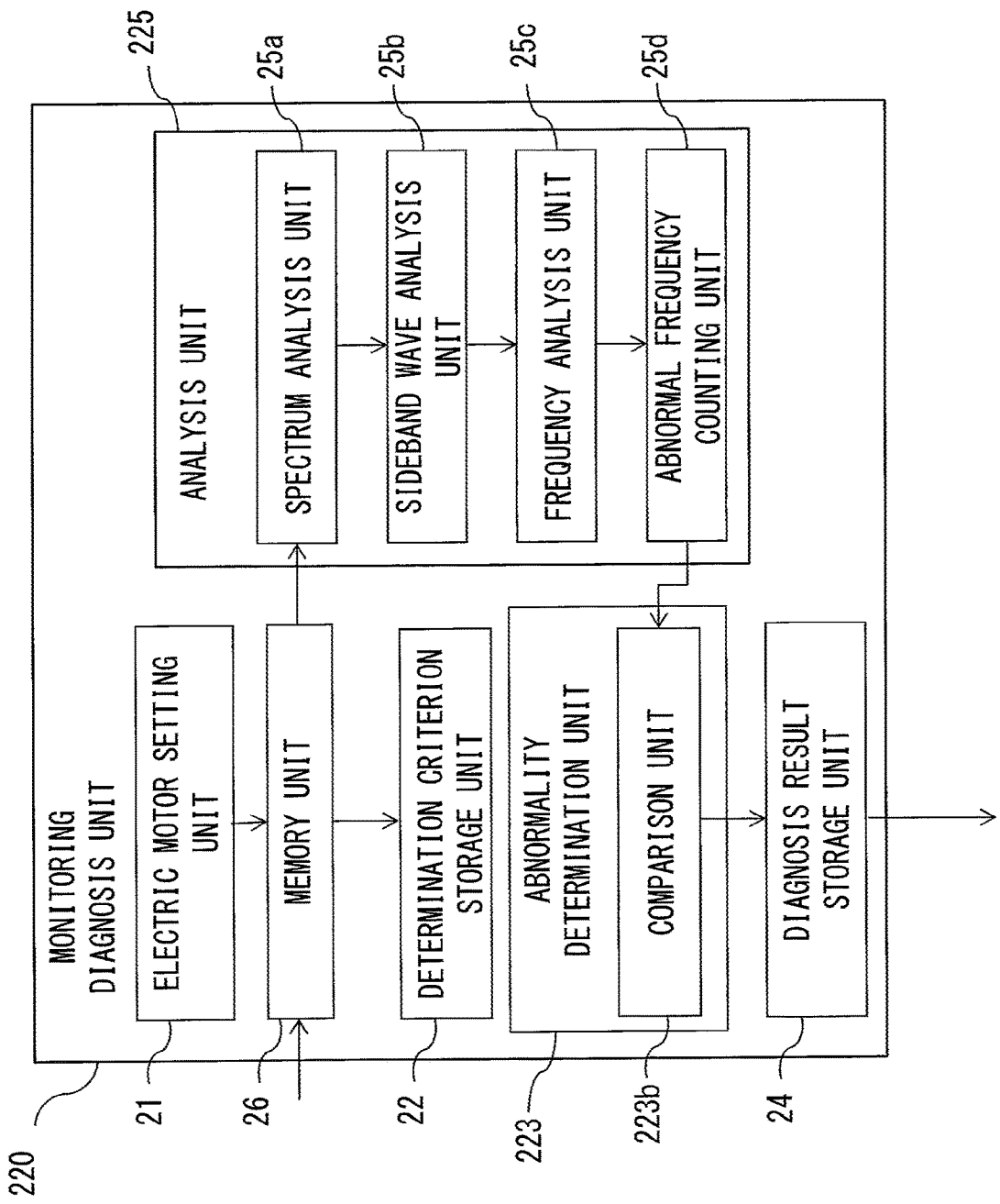
FIG. 7 is a diagram showing the configuration of a monitoring diagnosis unit of the abnormality diagnostic device according to embodiment 2 of the present invention.

FIG. 7 is a diagram showing the configuration of a monitoring diagnosis unit 220 of the abnormality diagnostic device 200.

Figure 8:
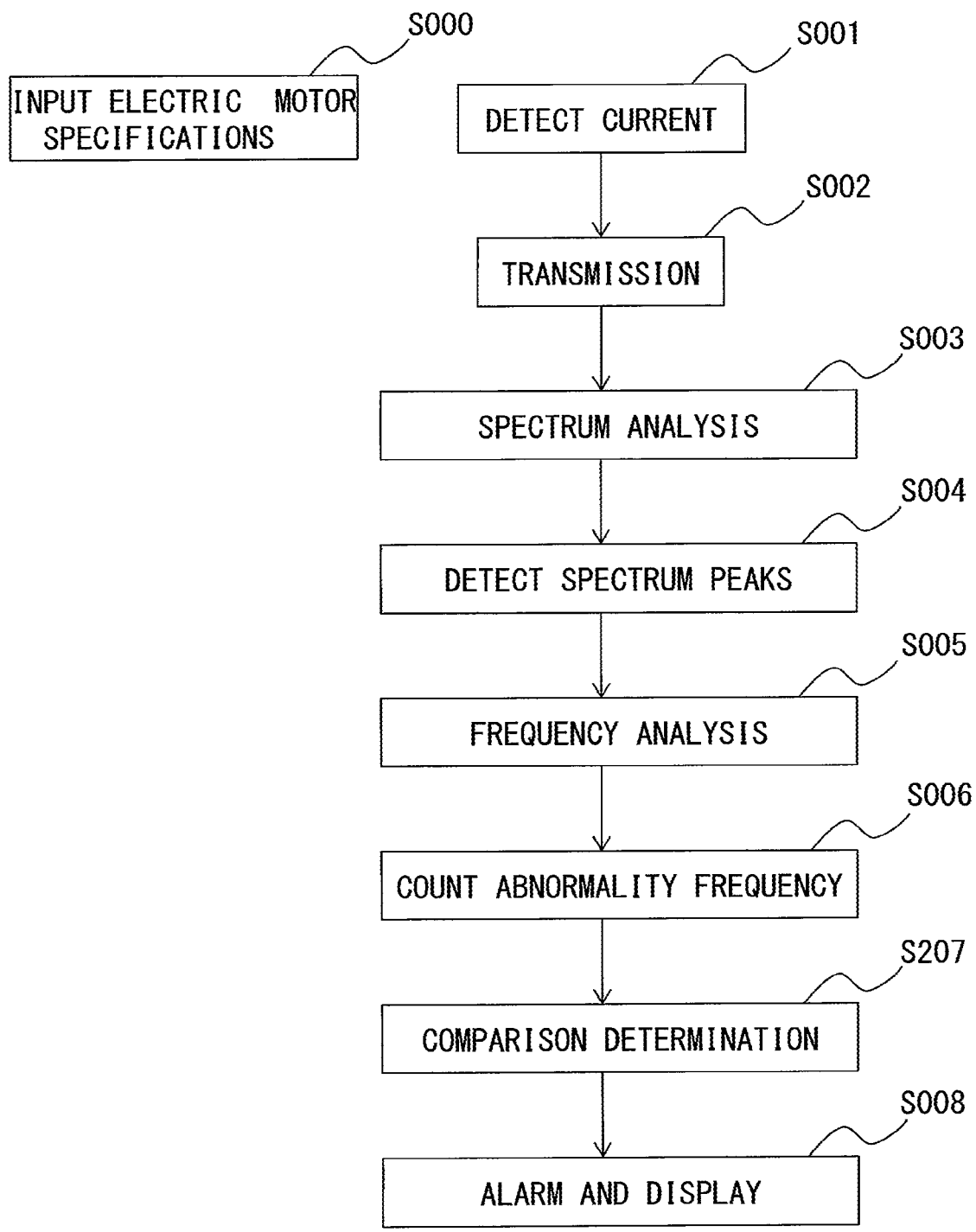
FIG. 8 shows a processing flow of the abnormality diagnostic device according to embodiment 2 of the present invention.

FIG. 8 shows a processing flow of the abnormality diagnostic device 200 (in the case of a plurality of same-type electric motors).

The abnormality diagnostic device 200 includes a monitoring diagnosis unit 220, a display unit 40, an alarm unit 50, and current detectors 70*a*, 70*b*, 70*c* each connected to one of three-phase electric lines connected to the corresponding electric motor 15*a* to 15*c*.

The monitoring diagnosis unit 220 of the abnormality diagnostic device 200 includes an electric motor setting unit 21, a determination criterion storage unit 22, an abnormality determination unit 223, a diagnosis result storage unit 24, and an analysis unit 225. In addition, the abnormality determination unit 223 includes a comparison unit 223*b* described later.

The electric motors 15*a* to 15*c* are connected to power supply lines 11*a*, 11*b*, 11*c* for driving the electric motors. On the respective sets of the power supply lines 11*a* to 11*c*, pluralities of wiring circuit breakers 12*a*, 12*b*, 12*c*, 12*d*, 12*e*, 12*f*, 12*g*, 12*h*, 12*i* and pluralities of electromagnetic contactors 13*a*, 13*b*, 13*c*, 13*d*, 13*e*, 13*f*, 13*g*, 13*h*, 13*i* are connected.

As described above, embodiment 1 and embodiment 2 are different in the number of electric motors managed by the control center, and different in that three belt mechanisms 6*a*, 6*b*, 6*c* can be collectively diagnosed by one abnormality diagnostic device 200.

The basic configuration of the monitoring diagnosis unit 220 is the same as that in embodiment 1. As described above, the analysis unit 225 performs current FFT analysis for the belt mechanisms 6*a* to 6*c* on the basis of current data sent from the three current detectors 70*a* to 70*c*.

Then, normally, the abnormality determination unit 223 performs abnormality determination for the belt mechanisms 6*a* to 6*c* in accordance with the flow shown in FIG. 3 in embodiment 1. On the other hand, for example, in the case where the electric motors and the load facilities are the same type, comparison determination by the comparison unit 223*b* is performed in accordance with the flow shown in FIG. 8. In the case where the electric motors and the load facilities are the same type, normally, similar waveforms are observed. Accordingly, spectral waveforms from the three current detectors 70*a* to 70*c* are compared with each other to perform abnormality determination.

Figure 9:
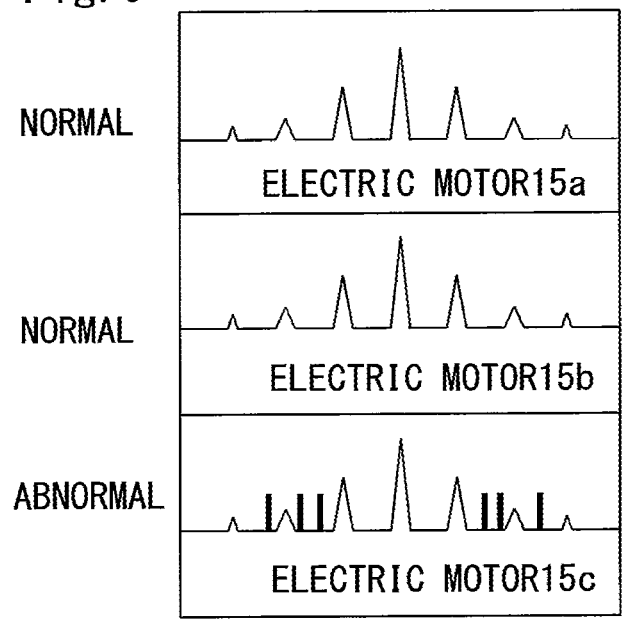
FIG. 9 shows comparison among spectral waveforms of respective electric motors according to embodiment 2 of the present invention.

FIG. 9 shows comparison among the spectral waveforms of the electric motors 15*a* to 15*c*.

According to comparison among these waveforms, the belt rotation frequency bands have the same shape in all the waveforms, but in the electric motor 15*c*, spectrum peaks different from those of the other electric motors 15*a*, 15*b* arise at frequencies other than the belt rotation frequency bands, and this can be determined as abnormality. In this case, it is only necessary to merely perform comparison among waveforms, and sideband waves and belt rotation frequency bands do not need to be detected. Thus, as shown in FIG. 8, instead of step S007 in embodiment 1, step S207 for comparison determination is used, and thus abnormality of the belt mechanisms 6*a* to 6*c* can be determined by merely extracting a waveform different from the other waveforms. At this time, if a plurality of spectrum peaks are detected in the vicinity of the belt rotation frequency bands, there is a high possibility that the belt has deteriorated.

With the abnormality diagnostic device 200 and the abnormality diagnostic method for a power transmission mechanism according to embodiment 2 of the present invention, the effects in embodiment 1 can be obtained, and in addition, for the same electric motors and the same power transmission mechanisms, abnormality determination for the belt mechanisms 6a to 6c can be easily performed by merely performing comparison among their spectral waveforms.

Embodiment 3

Hereinafter, with reference to the drawings, a power transmission mechanism abnormality diagnostic device and a power transmission mechanism abnormality diagnostic method according to embodiment 3 of the present invention will be described, focusing on difference from embodiment 1.

Figure 10:
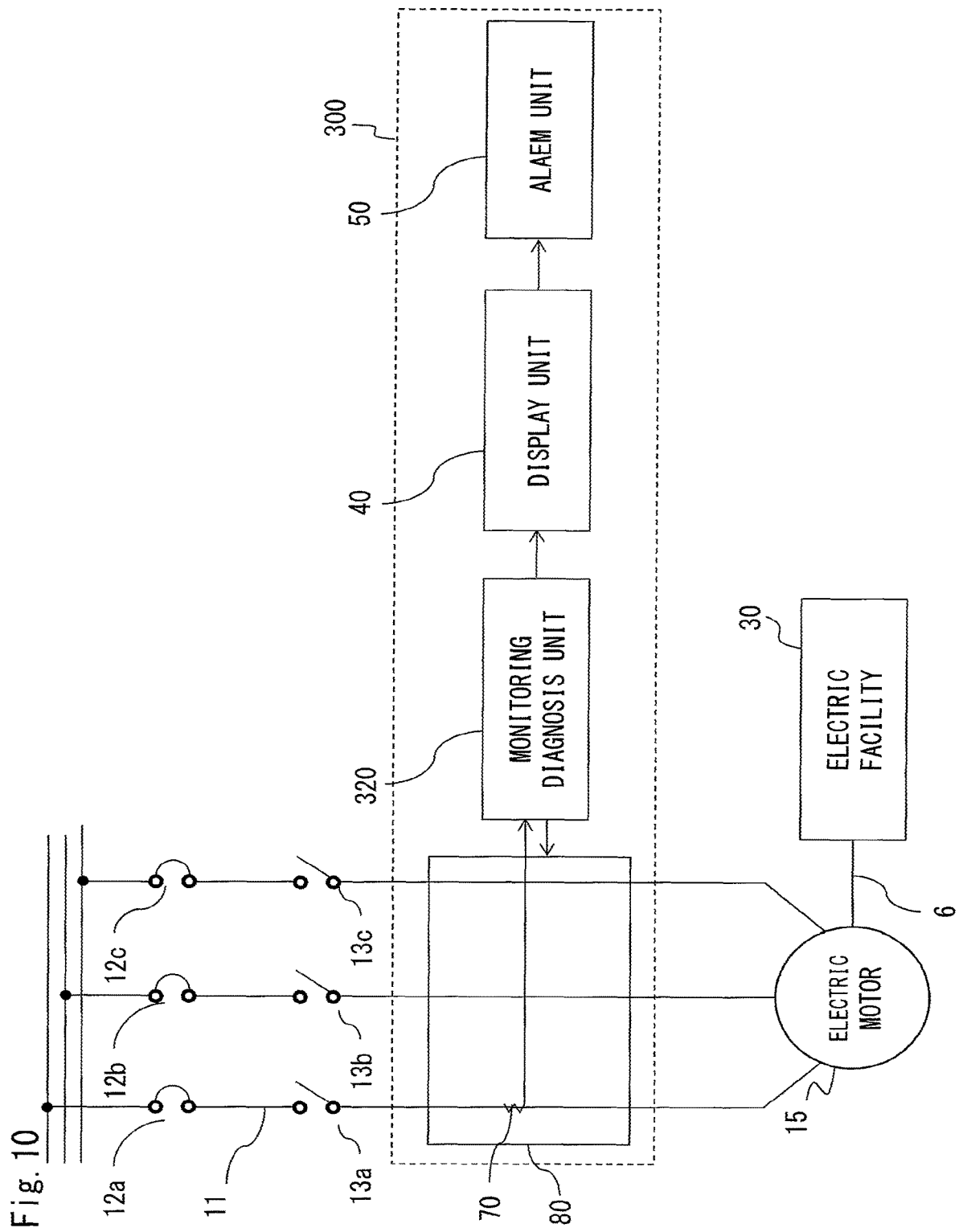
FIG. 10 is a diagram showing the configuration of an abnormality diagnostic device according to embodiment 3 of the present invention.

FIG. 10 is a diagram showing an electric motor 15 managed by a motor control center and the configuration of an abnormality diagnostic device 300 for detecting abnormality of the belt mechanism 6 (power transmission mechanism) which transmits power from the electric motor 15 to a mechanical facility 30 as a load.

Figure 11:
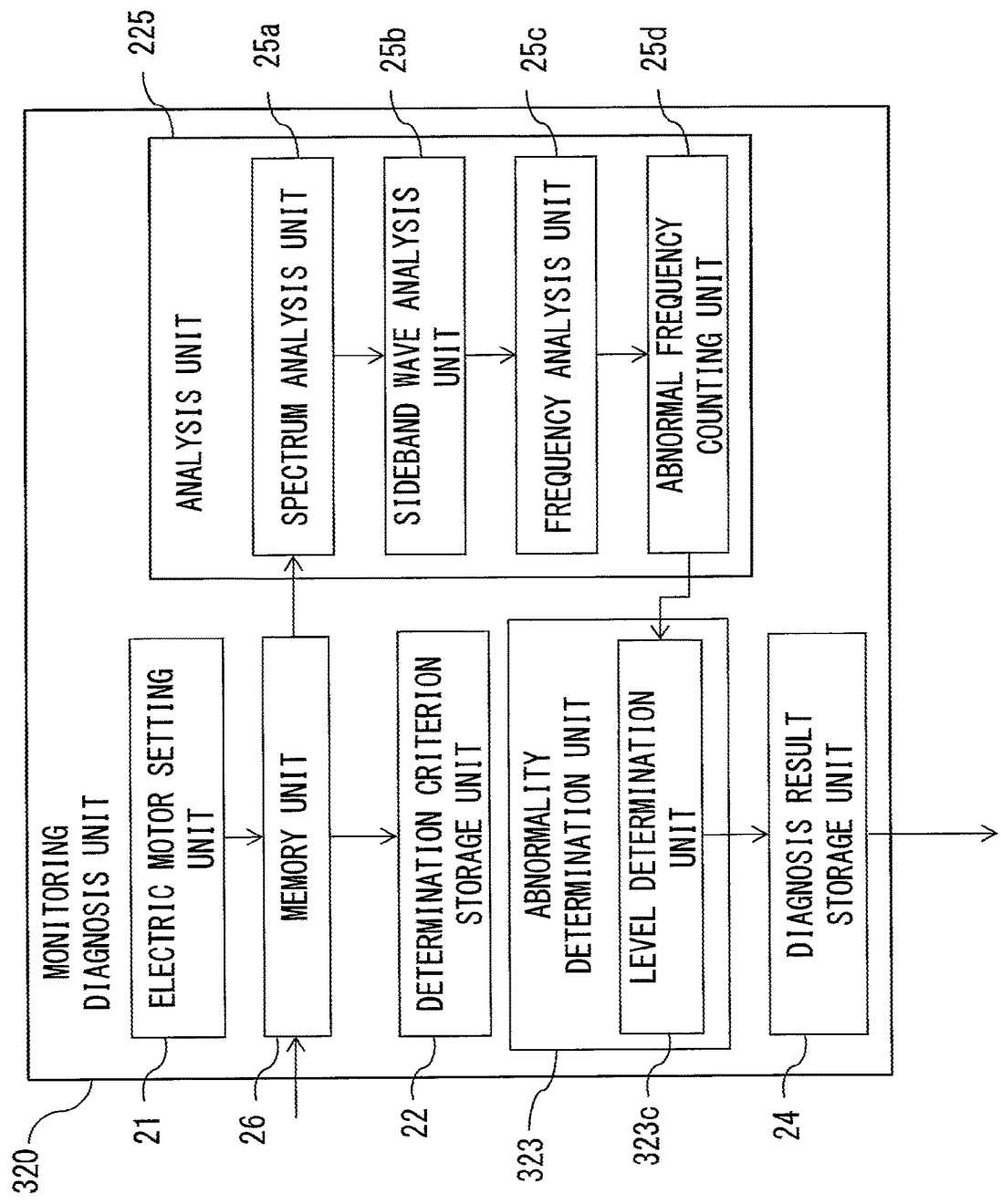
FIG. 11 is a diagram showing the configuration of a monitoring diagnosis unit of the abnormality diagnostic device according to embodiment 3 of the present invention.

FIG. 11 is a diagram showing the configuration of a monitoring diagnosis unit 320 of the abnormality diagnostic device 300.

Figure 12:
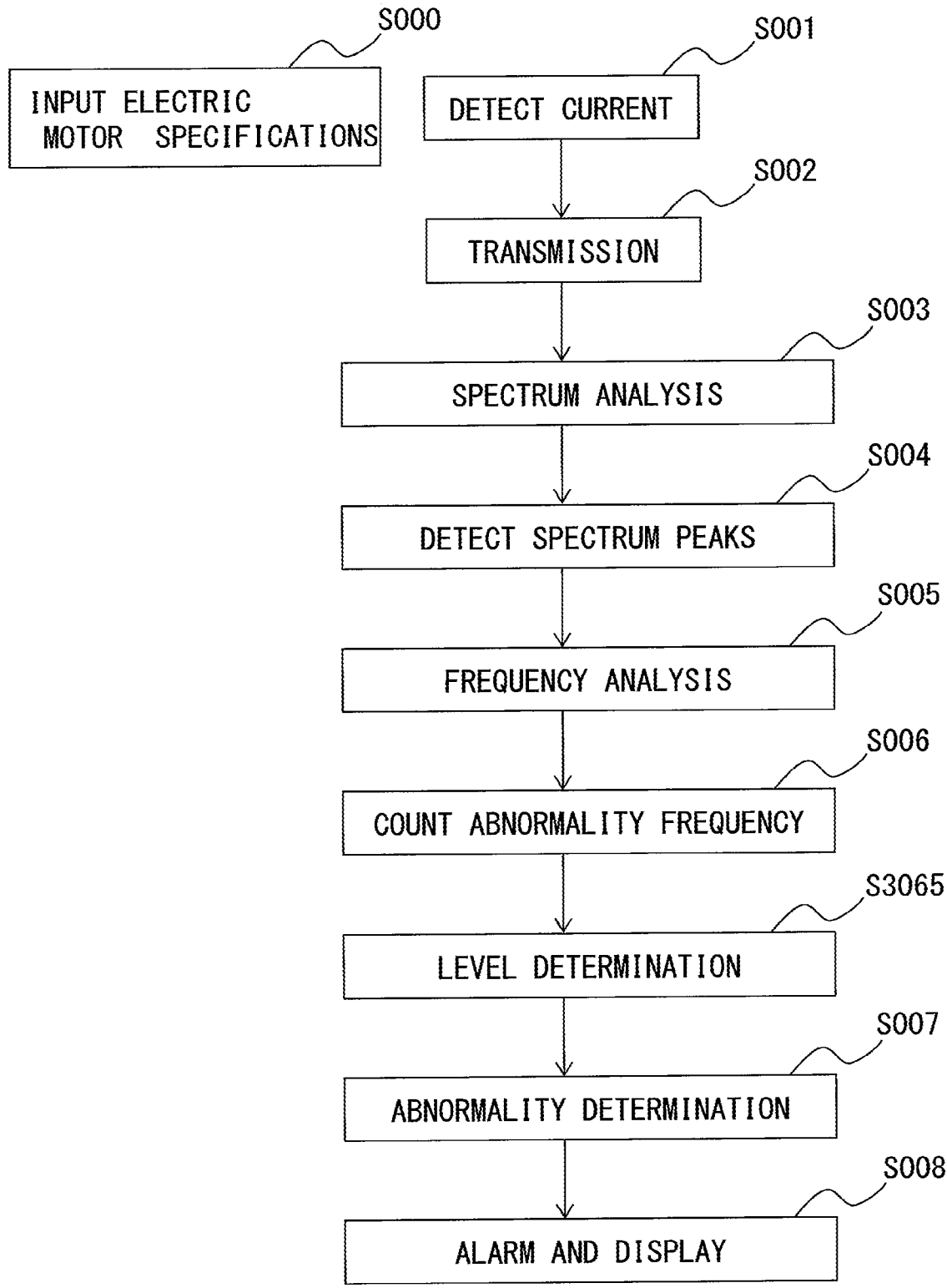
FIG. 12 shows a processing flow of the abnormality diagnostic device according to embodiment 3 of the present invention.

FIG. 12 shows a processing flow of the abnormality diagnostic device 300.

Difference between embodiment 1 and embodiment 3 is that an electric motor drive control device 80 is provided to the three-phase power supply.

The current detector 70 may be provided on the secondary side or the primary side of the electric motor drive control device 80, or may be provided therein. In any case, the acquired current data is transmitted to the monitoring diagnosis unit 320. Also the monitoring diagnosis unit 320 may be provided in the electric motor drive control device 80 or may be provided externally, but is configured such that the operation frequency of the electric motor drive control device 80 can be transmitted to the monitoring diagnosis unit 20.

In the current FFT analysis result in the present embodiment, the power supply frequency and harmonics thereof, the operation frequency of the electric motor drive control device and harmonics thereof, and the belt rotation frequencies are detected. In general, the signal intensities of the belt rotation frequencies are greater than the intensity of a noise signal from the electric motor drive control device 80.

The abnormality determination unit 323 of the monitoring diagnosis unit 320 includes a level determination unit 323c. The level determination unit 323c detects spectrum peak values and the number thereof, and determines a deterioration level on the basis of the number of spectrum peaks determined as abnormality (step S3065). For example, a normal case as shown on the upper side in FIG. 5 is determined as a deterioration level 1, and an abnormal case as shown on the lower side in FIG. 5 is determined as a deterioration level 2. Further, a case where many sideband waves determined as abnormality are detected is determined as a deterioration level 3. As a matter of course, the higher the deterioration level is, the greater the deterioration degree is.

The monitoring diagnosis unit 320 transmits the deterioration level to the electric motor drive control device 80. In accordance with this, the electric motor drive control device 80 controls the rotation speed of the electric motor 15. In the case of deterioration level 1, the electric motor 15 is operated at a normal speed. In the case of deterioration level 2, the rotation speed of the electric motor 15 is decreased by 10%. In the case of deterioration level 3, the rotation speed of the electric motor 15 is decreased by, for example, 20%.

Thus, the movement distance of the belt mechanism 6 per unit time decreases, whereby the belt BE can be prevented from rapidly deteriorating and the life of the belt BE can be extended.

As described above, by feeding back a result of deterioration diagnosis for the belt mechanism 6 to the electric motor drive control device 80, it is possible to achieve life extension of the belt mechanism 6 and decrease facility downtime. Means for achieving life extension of the belt mechanism 6 is not limited to decrease of the rotation speed of the electric motor 15. In the case where the deterioration level of the belt mechanism 6 is increased, the electric motor 15 may be controlled to be once stopped and then restarted. The reason is as follows. In the case of performing continuous operation, deterioration of the belt mechanism 6 progresses at an accelerating pace. Therefore, the operation is once stopped so that the belt mechanism 6 is naturally cooled, whereby accelerating deterioration progress can be suppressed.

In addition, control for finding a rotation speed that causes less vibration may be performed. For example, spectrum peak values of abnormality frequency bands and the number thereof are detected for each rotation speed of the electric motor 15. Among these, a rotation speed for which the number of such spectrum peaks is the smallest is specified, and the electric motor 15 is operated at the specified rotation speed. Thus, the electric motor 15 can be operated in a state in which the deterioration level is small.

Alternatively, rotation speed control may be performed so that the number of such spectrum peaks is maintained to be a predetermined number or smaller. Regarding the rotation speed, the allowable rotation range has been already determined for each electric motor 15 and each load facility. Therefore, the upper limit and the lower limit of the rotation speed of the electric motor 15 are determined in advance. Alternatively, in the case of a load facility in which the characteristics do not change even if the electric motor 15 is reversely rotated, the electric motor 15 may be reversely rotated when the deterioration level increases. By performing reverse rotation, a collision surface arises at a part different from the worn deteriorated part, and thus the life of the belt mechanism 6 might be extended.

With the abnormality diagnostic device 300 and the abnormality diagnostic method for a power transmission mechanism according to embodiment 3 of the present invention, the effects in embodiment 1 can be obtained, and in addition, the life of the belt mechanism 6 can be extended by performing feedback control for the electric motor 15 in accordance with the deterioration level of the belt mechanism 6.

Embodiment 4

Hereinafter, with reference to the drawings, a power transmission mechanism abnormality diagnostic device and a power transmission mechanism abnormality diagnostic method according to embodiment 4 of the present invention will be described, focusing on difference from embodiments 1 to 3.

Figure 13:
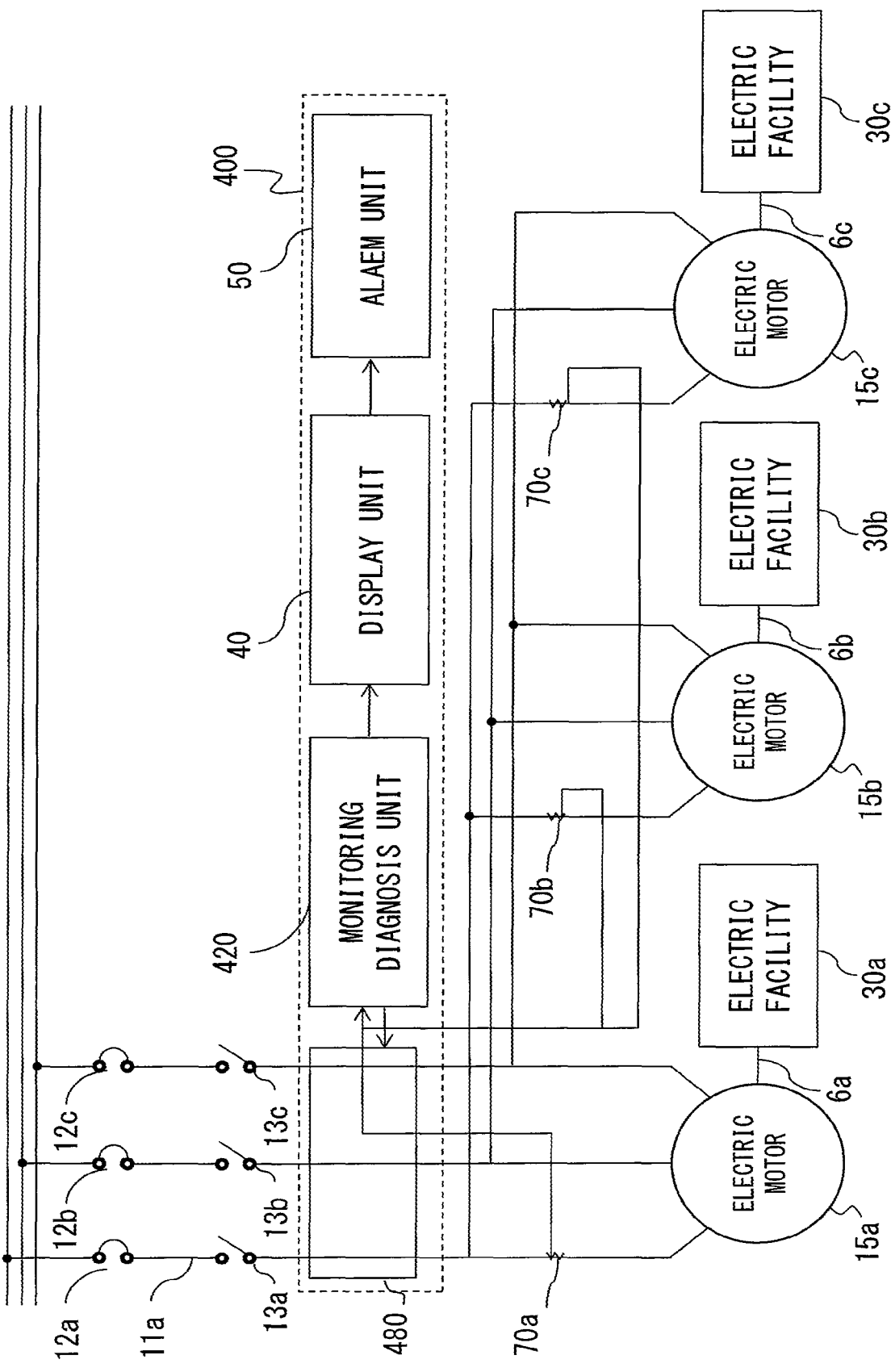
FIG. 13 is a diagram showing the configuration of an abnormality diagnostic device according to embodiment 4 of the present invention.

FIG. 13 is diagram showing electric motors 15a to 15c managed by a motor control center and the configuration of an abnormality diagnostic device 400 for detecting abnormality of belt mechanisms 6a to 6b (power transmission mechanisms) which transmit powers from the electric motors 15a to 15c to respective mechanical facilities 30a to 30c as loads.

In the present embodiment, a plurality of electric motors 15a to 15c are connected with respect to one electric motor drive control device 480. This configuration is permitted only in the case where the total output capacity of the electric motors 15a to 15c is not greater than the capacity of the electric motor drive control device 480. In this case, current detectors 70a to 70c are provided to wiring lines of the electric motors 15a to 15c, and the measured current data is stored into the electric motor drive control device 480. Thus, the plurality of electric motors 15a to 15c can be collectively monitored. Then, as in embodiments 2 and 3, an abnormality determination unit of the monitoring diagnosis unit 420 specifies the electric motor and the load facility for which the belt mechanism has deteriorated, and performs control of the rotation speed or the like for extending the life of the belt. The control may be performed for each electric motor 15a to 15c, or may be performed for the plurality of electric motors collectively.

Embodiment 5

Hereinafter, with reference to the drawings, a power transmission mechanism abnormality diagnostic device and a power transmission mechanism abnormality diagnostic method according to embodiment 5 of the present invention will be described, focusing on difference from embodiment 1.

In embodiments 1 to 4, detection of abnormality when the belt BE deteriorates and cracks has been described. In the present embodiment, a power transmission mechanism abnormality diagnostic device and a power transmission mechanism abnormality diagnostic method that are capable of coping with such a sudden event that the belt BE cracks and immediately the belt BE is broken, will be described.

Figure 16:
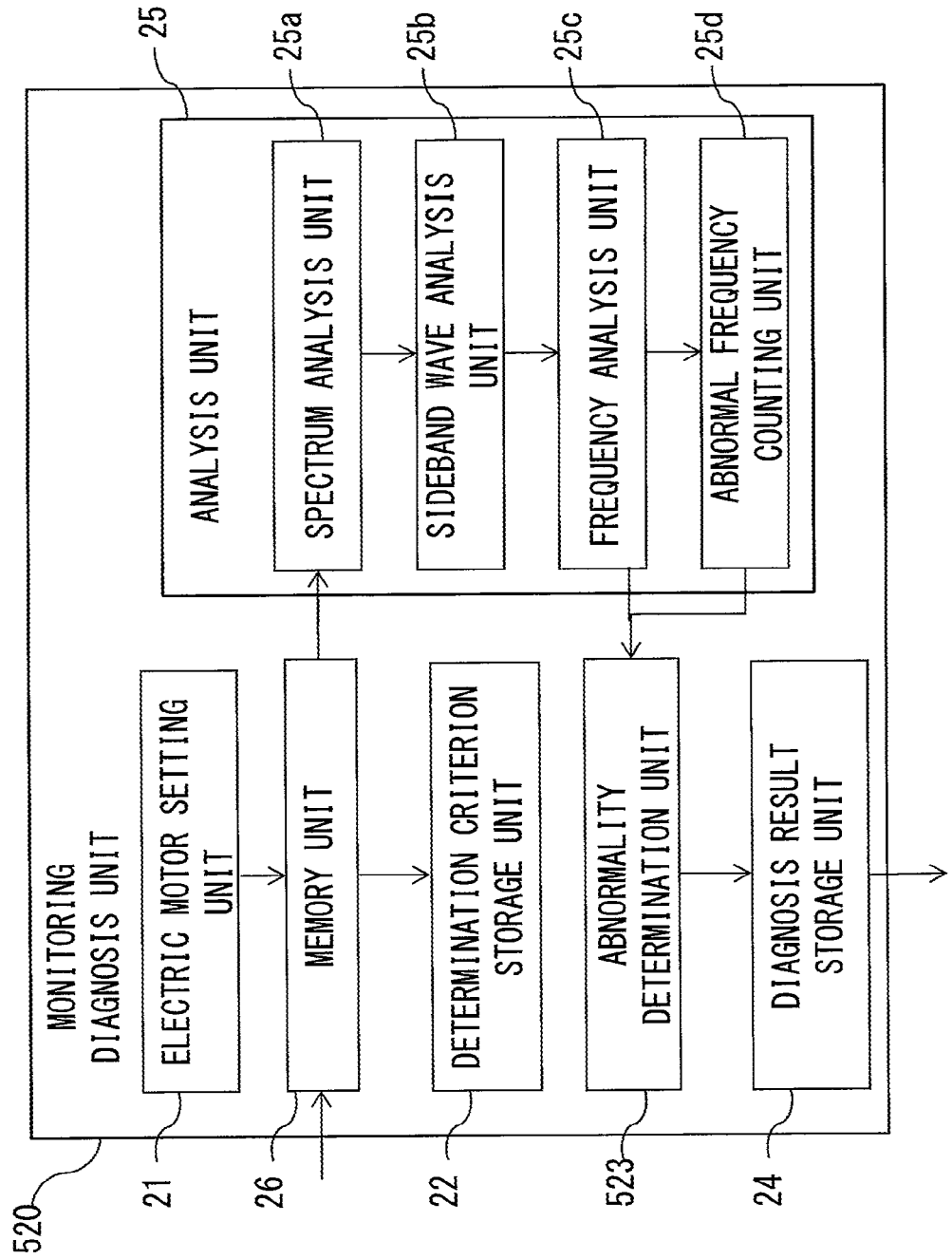
FIG. 16 is a diagram showing the configuration of a monitoring diagnosis unit of an abnormality diagnostic device according to embodiment 5 of the present invention.

FIG. 16 is a diagram showing the configuration of a monitoring diagnosis unit 520.

Figure 17:
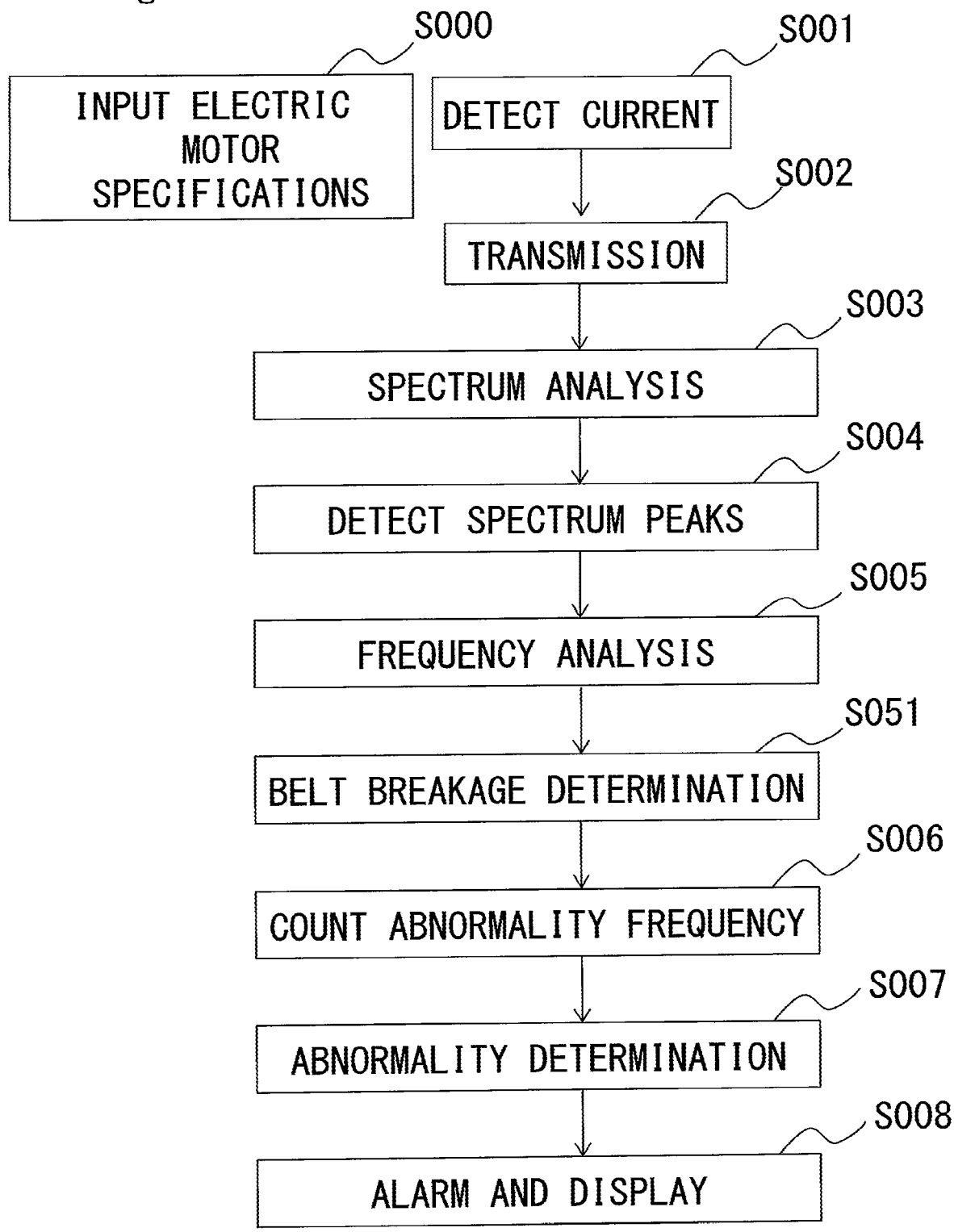
FIG. 17 shows a processing flow of the abnormality diagnostic device according to embodiment 5 of the present invention.

FIG. 17 shows a processing flow of the abnormality diagnostic device.

Figure 18A:
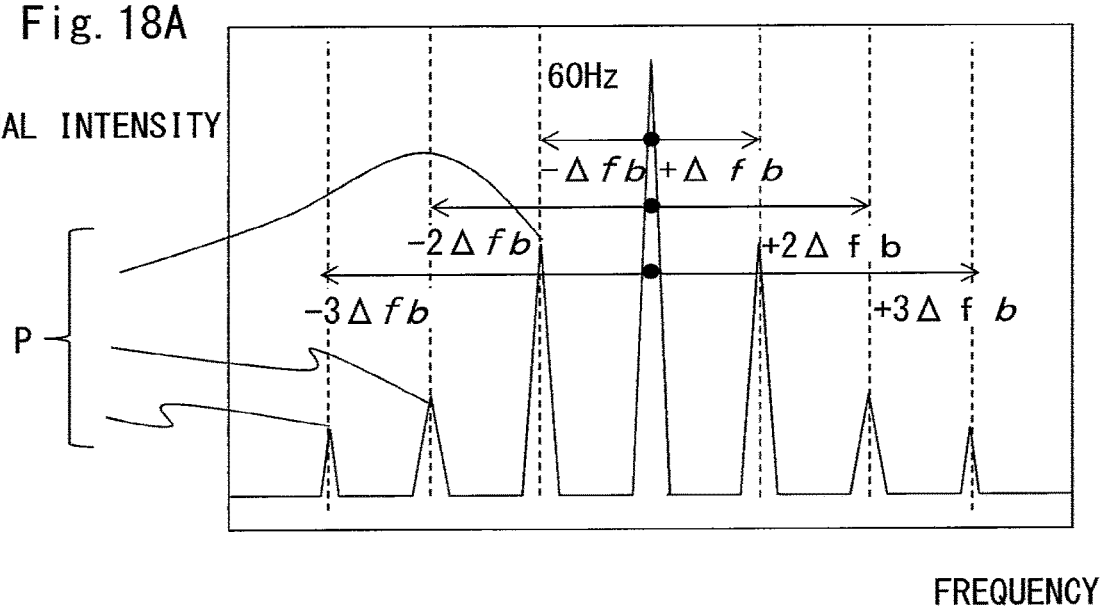
FIG. 18A shows current spectral waveforms of an electric motor before belt breakage.

FIG. 18A shows a current spectral waveform of the electric motor 15 before the belt is broken.

Figure 18B:
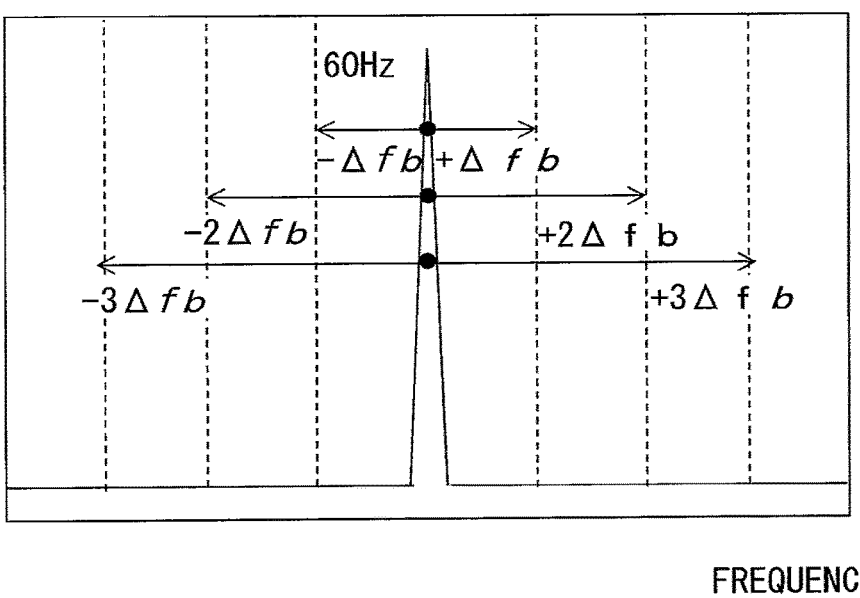
FIG. 18B shows current spectral waveforms of an electric motor after belt breakage.

FIG. 18B shows a current spectral waveform of the electric motor 15 after the belt is broken.

When the belt BE is broken, as shown in FIG. 18B, the spectrum peaks P of the belt rotation frequency bands (power transmission mechanism frequency bands) that have appeared at intervals of +Δfb, +2Δfb, +3Δfb, etc., on the higher side and −Δb, −2Δfb, −3Δfb, etc., on the lower side with respect to the power supply frequency, disappear. This is because the electric motor 15 rotates with no load as a result of the belt breakage. Therefore, the number of the spectrum peaks P of the belt rotation frequency bands is counted by the frequency analysis unit 25c, and if the number is zero, an abnormality determination unit 523 determines that the belt is broken (step S051).

With the abnormality diagnostic device and the abnormality diagnostic method for a power transmission mechanism according to embodiment 5 of the present invention, the effects in embodiment 1 can be obtained, and in addition, since belt breakage can be immediately determined, it is possible to suppress loss due to belt breakage to a minimum level by swiftly stopping the power transmission mechanism and recovering the system. The same applies for the case of chain breakage.

It is noted that, within the scope of the present invention, the above embodiments may be freely combined with each other, or each of the above embodiments may be modified or simplified as appropriate.

The invention claimed is:

1. A power transmission mechanism abnormality diagnostic device for detecting abnormality of a power transmission mechanism which transmits power from an electric motor to a mechanical facility as a load, the power transmission mechanism abnormality diagnostic device comprising:
   a monitoring diagnosis unit for performing determination as to abnormality of the power transmission mechanism; and
   a current detector connected to a power supply line of the electric motor, wherein
   the monitoring diagnosis unit includes:
      an analysis unit for analyzing current transmitted from the current detector; and
      an abnormality determination unit for performing determination as to abnormality of the power transmission mechanism on the basis of a result of analysis by the analysis unit.

2. The power transmission mechanism abnormality diagnostic device according to claim 1, wherein
   the analysis unit includes:
      a spectrum analysis unit for analyzing a drive current spectral waveform for the electric motor;
      a sideband wave analysis unit for detecting spectrum peaks from the drive current spectral waveform;
      a frequency analysis unit for analyzing, among the detected spectrum peaks, a power transmission mechanism frequency band that occurs in accordance with a rotation speed of the power transmission mechanism; and
      an abnormality frequency counting unit for detecting a number of sideband waves other than a frequency of a power supply and a power transmission mechanism frequency.

3. The power transmission mechanism abnormality diagnostic device according to claim 2, wherein
   the abnormality determination unit includes a level determination unit for determining a level of the abnormality on the basis of the detected number of sideband waves other than the power transmission mechanism frequency.

4. The power transmission mechanism abnormality diagnostic device according to claim 3, further comprising an electric motor drive control device provided between the power supply and the electric motor, wherein
   the abnormality frequency counting unit detects a number of sideband waves other than an operation frequency of the electric motor drive control device.

5. The power transmission mechanism abnormality diagnostic device according to claim 4, wherein
   the monitoring diagnosis unit feeds back abnormality of the power transmission mechanism to the electric motor drive control device, and
   the electric motor drive control device controls rotation of the electric motor in accordance with the level of the abnormality.

6. The power transmission mechanism abnormality diagnostic device according to claim 4, wherein
   the monitoring diagnosis unit analyzes the currents from a plurality of the current detectors respectively connected to the power supply lines of a plurality of the electric motors, and performs determination as to abnormality of the power transmission mechanism connected to each electric motor.

7. The power transmission mechanism abnormality diagnostic device according to claim 6, wherein the abnormality determination unit includes a comparison unit for comparing drive current spectral waveforms obtained by analysis of the currents from the plurality of current detectors.

8. The power transmission mechanism abnormality diagnostic device according to claim 3, wherein
the monitoring diagnosis unit analyzes the currents from a plurality of the current detectors respectively connected to the power supply lines of a plurality of the electric motors, and performs determination as to abnormality of the power transmission mechanism connected to each electric motor.

9. The power transmission mechanism abnormality diagnostic device according to claim 8, wherein
the abnormality determination unit includes a comparison unit for comparing drive current spectral waveforms obtained by analysis of the currents from the plurality of current detectors.

10. The power transmission mechanism abnormality diagnostic device according to claim 2, further comprising an electric motor drive control device provided between the power supply and the electric motor, wherein
the abnormality frequency counting unit detects a number of sideband waves other than an operation frequency of the electric motor drive control device.

11. The power transmission mechanism abnormality diagnostic device according to claim 10, wherein
the monitoring diagnosis unit feeds back abnormality of the power transmission mechanism to the electric motor drive control device, and
the electric motor drive control device controls rotation of the electric motor in accordance with the level of the abnormality.

12. The power transmission mechanism abnormality diagnostic device according to claim 10, wherein
the monitoring diagnosis unit analyzes the currents from a plurality of the current detectors respectively connected to the power supply lines of a plurality of the electric motors, and performs determination as to abnormality of the power transmission mechanism connected to each electric motor.

13. The power transmission mechanism abnormality diagnostic device according to claim 12, wherein
the abnormality determination unit includes a comparison unit for comparing drive current spectral waveforms obtained by analysis of the currents from the plurality of current detectors.

14. The power transmission mechanism abnormality diagnostic device according to claim 2, wherein
the monitoring diagnosis unit analyzes the currents from a plurality of the current detectors respectively connected to the power supply lines of a plurality of the electric motors, and performs determination as to abnormality of the power transmission mechanism connected to each electric motor.

15. The power transmission mechanism abnormality diagnostic device according to claim 14, wherein
the abnormality determination unit includes a comparison unit for comparing drive current spectral waveforms obtained by analysis of the currents from the plurality of current detectors.

16. The power transmission mechanism abnormality diagnostic device according to claim 1, wherein
the monitoring diagnosis unit analyzes the currents from a plurality of the current detectors respectively connected to the power supply lines of a plurality of the electric motors, and performs determination as to abnormality of the power transmission mechanism connected to each electric motor.

17. The power transmission mechanism abnormality diagnostic device according to claim 16, wherein
the abnormality determination unit includes a comparison unit for comparing drive current spectral waveforms obtained by analysis of the currents from the plurality of current detectors.

18. A power transmission mechanism abnormality diagnostic method for detecting abnormality of a power transmission mechanism which transmits power from an electric motor to a mechanical facility as a load, the power transmission mechanism abnormality diagnostic method comprising:
a first step of measuring current flowing through the electric motor;
a second step of transmitting a value of the current to a monitoring diagnosis unit;
a third step of performing frequency analysis of the current;
a fourth step of detecting outstanding spectrum peaks from a drive current spectral waveform obtained in the second step;
a fifth step of detecting, among the spectrum peaks detected in the fourth step, a plurality of spectrum peaks that are located at equal intervals and have signal intensities equal to or greater than a threshold value, and determining the plurality of spectrum peaks as power transmission mechanism frequency bands that occur in accordance with a rotation speed of the power transmission mechanism;
a sixth step of detecting a number of sideband waves other than a power supply frequency, a power transmission mechanism frequency, and a rotation frequency of the electric motor; and
a seventh step of determining whether or not abnormality occurs in the power transmission mechanism, on the basis of the number of the sideband waves.

19. The power transmission mechanism abnormality diagnostic method according to claim 18, wherein
the fifth step includes an eighth step of determining that a power transmission member of the power transmission mechanism is broken, if a number of the spectrum peaks determined as the power transmission mechanism frequency bands is zero.

20. A power transmission mechanism abnormality diagnostic method for detecting abnormality of power transmission mechanisms which transmit powers from a plurality of electric motors to respective mechanical facilities as loads, the power transmission mechanism abnormality diagnostic method comprising:
a first step of measuring currents flowing through the electric motors;
a second step of transmitting values of the currents to a monitoring diagnosis unit;
a third step of performing frequency analysis of the currents; and
a fourth step of comparing drive current spectral waveforms obtained in the third step, and determining whether or not abnormality occurs in the power transmission mechanism.

\* \* \* \* \*